US012597928B2

(12) United States Patent (10) Patent No.: US 12,597,928 B2
Quaglino et al. (45) Date of Patent: Apr. 7, 2026

(54) LEVEL SHIFTER FOR POWER ELECTRONICS CIRCUITS

(71) Applicant: Infineon Technologies Austria AG, Villach (AT)

(72) Inventors: Roberto Quaglino, Villach (AT); Arnaud Philippe Albert Perroy, Villach (AT)

(73) Assignee: Infineon Technologies Austria AG, Villach (AT)

( * ) Notice: Subject to any disclaimer, the term of this patent is extended or adjusted under 35 U.S.C. 154(b) by 220 days.

(21) Appl. No.: 18/600,823

(22) Filed: Mar. 11, 2024

(65) Prior Publication Data

US 2025/0286553 A1      Sep. 11, 2025

(51) Int. Cl.
   *H03K 19/0175*     (2006.01)
   *H02M 1/08*     (2006.01)
   *H02M 1/088*     (2006.01)
   *H02M 3/155*     (2006.01)
   *H03K 17/00*     (2006.01)
   *H02M 1/00*     (2006.01)

(52) U.S. Cl.
   CPC ...... *H03K 19/017509* (2013.01); *H02M 1/08* (2013.01); *H02M 1/088* (2013.01); *H02M 3/155* (2013.01); *H03K 17/00* (2013.01); *H02M 1/0006* (2021.05)

(58) Field of Classification Search
   CPC . H03K 19/017509; H03K 17/00; H02M 1/08; H02M 1/088; H02M 3/155; H02M 1/0006
   See application file for complete search history.

(56) References Cited

U.S. PATENT DOCUMENTS 4,692,641 A * 9/1987 Highton ........... H03K 19/01812
                                                              326/18
4,945,265 A * 7/1990 Estrada ................ H03K 3/2885
                                                              326/126

(Continued)

OTHER PUBLICATIONS

Costa Beber Vieira, Filipe, et al., "Level Shifter for Power Converters", U.S. Appl. No. 18/475,341, filed Sep. 27, 2023, pp. pp. 1-49.

(Continued)

*Primary Examiner* — Yusef A Ahmed
(74) *Attorney, Agent, or Firm* — Murphy, Bilak & Homiller, PLLC

(57)      ABSTRACT

A level shifter includes: a current pulse generation circuit coupled to a first supply rail and a first (ground) reference rail and configured to output non-overlapping first and second current pulses based on opposite edges of a logic input signal; a latch and a current mirror circuit coupled to a second supply rail and a second reference rail and configured to mirror the non-overlapping first and second current pulses such that the latch is set when the first current pulse is active and reset when the second current pulse is active, the second reference rail; and a voltage headroom circuit configured to mitigate voltage headroom loss between the second supply rail and the first reference rail, independent of an electric potential difference of the second reference rail. A power electronics circuit that includes the level shifter is also described.

20 Claims, 3 Drawing Sheets

(56) References Cited

U.S. PATENT DOCUMENTS

| | | | | |
|---|---|---|---|---|
| 6,211,706 | B1 * | 4/2001 | Choi | H03K 17/6871 |
| | | | | 327/108 |
| 7,893,730 | B2 * | 2/2011 | Jung | H03K 19/018521 |
| | | | | 327/333 |
| 8,598,936 | B2 * | 12/2013 | Kuge | H03K 19/003 |
| | | | | 327/333 |
| 9,722,610 | B2 * | 8/2017 | Akahane | H03K 17/04123 |
| 9,979,397 | B1 * | 5/2018 | Zhu | H03K 19/017509 |
| 10,193,554 | B1 * | 1/2019 | Sharma | H03K 17/08 |
| 10,483,977 | B1 * | 11/2019 | Berwick | H03K 19/018521 |
| 10,536,140 | B1 * | 1/2020 | Ribarich | H03K 17/0822 |
| 10,749,509 | B1 | 8/2020 | Cascio et al. | |
| 10,868,536 | B1 * | 12/2020 | Ke | H03K 19/018514 |
| 11,183,835 | B2 * | 11/2021 | Lee | H03K 17/08 |
| 11,606,031 | B1 * | 3/2023 | Oporta | H03K 17/063 |
| 11,942,942 | B1 * | 3/2024 | Chan | H10D 30/659 |
| 12,362,752 | B2 * | 7/2025 | Lam | H03K 3/35613 |
| 2002/0105311 | A1 | 8/2002 | Rutter et al. | |
| 2005/0122754 | A1 * | 6/2005 | Nielsen | H03K 17/063 |
| | | | | 363/132 |
| 2012/0229165 | A1 * | 9/2012 | Tseng | H03K 19/00361 |
| | | | | 326/82 |
| 2014/0152369 | A1 * | 6/2014 | Qi | H03K 19/018528 |
| | | | | 327/333 |
| 2016/0277008 | A1 * | 9/2016 | Green | H03K 19/018514 |
| 2017/0110971 | A1 * | 4/2017 | Degen | H02M 3/33571 |
| 2018/0034466 | A1 * | 2/2018 | Zhang | H03K 19/018514 |
| 2018/0302072 | A1 * | 10/2018 | Abesingha | H02M 1/38 |
| 2019/0140635 | A1 * | 5/2019 | Abesingha | H03K 17/0822 |
| 2020/0018782 | A1 * | 1/2020 | Gupta | G01R 31/382 |
| 2020/0044648 | A1 * | 2/2020 | Sharma | H03K 17/6871 |
| 2020/0162074 | A1 * | 5/2020 | Niikura | H03K 17/04123 |
| 2020/0382122 | A1 * | 12/2020 | Niikura | H03K 3/037 |
| 2021/0218389 | A1 * | 7/2021 | Rajalakshmi | H03K 3/35613 |
| 2021/0351686 | A1 * | 11/2021 | Bognanni | H03K 17/063 |
| 2022/0103162 | A1 * | 3/2022 | Shuvalov | H03K 19/018528 |
| 2022/0302839 | A1 * | 9/2022 | Ishino | G05F 3/26 |
| 2024/0106318 | A1 * | 3/2024 | Kwak | H02M 1/08 |
| 2025/0175179 | A1 * | 5/2025 | Hsu | H03K 19/018521 |
| 2025/0211231 | A1 * | 6/2025 | Lin | H03K 17/08122 |

OTHER PUBLICATIONS

Hsu, Ching Tiu, et al., "Level Shifter Having a Cross-Coupled Current Mirror Circuit for Reducing or Cancelling Common Mode Slew Current", U.S. Appl. No. 18/523,125, filed Nov. 29, 2023, pp. pp. 1-28.

* cited by examiner

LEVEL SHIFTER FOR POWER ELECTRONICS CIRCUITS

BACKGROUND

Power converters such as half and full bridge converters typically use a bootstrap technique which includes a bootstrap capacitor to create a floating voltage domain to drive one or more high-side power switches of the power converter. In a typical application of a DC-DC buck converter, in the time interval between when the high-side power switch is active and the low-side power switch is active, there is dead time when all of the power switches are off. During the dead time, the output inductor forces a current to flow, and as a consequence, the switching node of the power converter is forced to a negative value. If silicon transistors are used to implement the power switches, the low-side power switch has a body diode that limits the negative voltage at the switching node to around −0.7V. If a GaN transistor(s) is used to implement the low-side power switch, the low-side power switch does not have a body diode but can conduct current if the voltage between the drain and gate creates a channel. In this case, the switching node of the power converter is forced to a more negative voltage such as in a range of −2V to −5V.

Due to the existence of the bootstrap capacitor, the bootstrap node, which is the positive supply voltage of the high side driver, follows the switching node of the power converter, falling to a level close to ground. To leave the dead time mode, the input control of high side driver toggles, sending a signal from the low-voltage input domain to the high side domain through a level shifter, and finally toggling the driver for the high-side power switch. The switching node of the power converter goes negative when the high-side input is activated to toggle the high-side power switch. Since there is a floating supply (e.g., 5V) and the level shifter is referenced to a fixed 0V, there is not enough voltage headroom for the level shifter to propagate the current signal.

Thus, there is a need for a level shifter design with improved voltage headroom for power converter applications.

SUMMARY

According to an embodiment of a level shifter, the level shifter comprises: a current pulse generation circuit coupled to a first supply rail and a first reference rail and configured to output non-overlapping first and second current pulses based on opposite edges of a logic input signal, the first reference rail being at ground; a latch and a current mirror circuit coupled to a second supply rail and a second reference rail, the current mirror circuit configured to mirror the non-overlapping first and second current pulses such that the latch is set when the first current pulse is active and reset when the second current pulse is active; and a voltage headroom circuit configured to mitigate voltage headroom loss between the second supply rail and the first reference rail, independent of an electric potential difference of the second reference rail.

According to an embodiment of a power electronics circuit, the power electronics circuit comprises: a power converter circuit comprising a high-side GaN switch device coupled in series with a low-side GaN switch device at a switch node; a first gate driver configured to drive a gate of the low-side GaN switch device; and a second gate driver configured to drive a gate of the high-side GaN switch device, wherein the second gate driver comprises: a current pulse generation circuit coupled to a first supply rail and a first reference rail and configured to output non-overlapping first and second current pulses based on opposite edges of a logic input signal, the first reference rail being at ground; a latch and a current mirror circuit coupled to a second supply rail and a second reference rail, the current mirror circuit configured to mirror the non-overlapping first and second current pulses such that the latch is set when the first current pulse is active and reset when the second current pulse is active, the second reference rail corresponding to the switch node of the power converter circuit; and a voltage headroom circuit configured to mitigate voltage headroom loss between the second supply rail and the first reference rail, independent of the electric potential difference of the second reference rail.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a level shifter having a voltage headroom circuit for mitigating voltage headroom loss. The level shifter may be used in power electronics applications such as half and full bridge converters. The level shifter also includes a current pulse generation circuit, a latch, and a current mirror circuit. The current pulse generation circuit is coupled to a first supply rail and a first reference rail, and outputs non-overlapping first (set) and second (reset) current pulses based on opposite edges of a logic input signal, where the first reference rail is at ground. The latch and current mirror circuit are coupled to a second supply rail and a second reference rail. The current mirror circuit mirrors the non-overlapping set and reset current pulses, such that the latch is set when the first current pulse is active and reset when the second current pulse is active. The second reference rail is designed to be coupled to a switch node of a power converter circuit and therefore has a variable electric potential difference when the power converter circuit is in use. The voltage headroom circuit mitigates voltage headroom loss between the second supply rail and the first reference rail, independent of the electric potential difference of the second reference rail. This allows the level shifter to propagate a current signal for driving a high-side GaN switch device of the power converter circuit, even when the switch node of the power converter circuit is at a negative potential such as −2V, −5V or even −8V.

Described next, with reference to the figures, are exemplary embodiments of the level shifter and a power electronics circuit that includes the level shifter.

Figure 1:
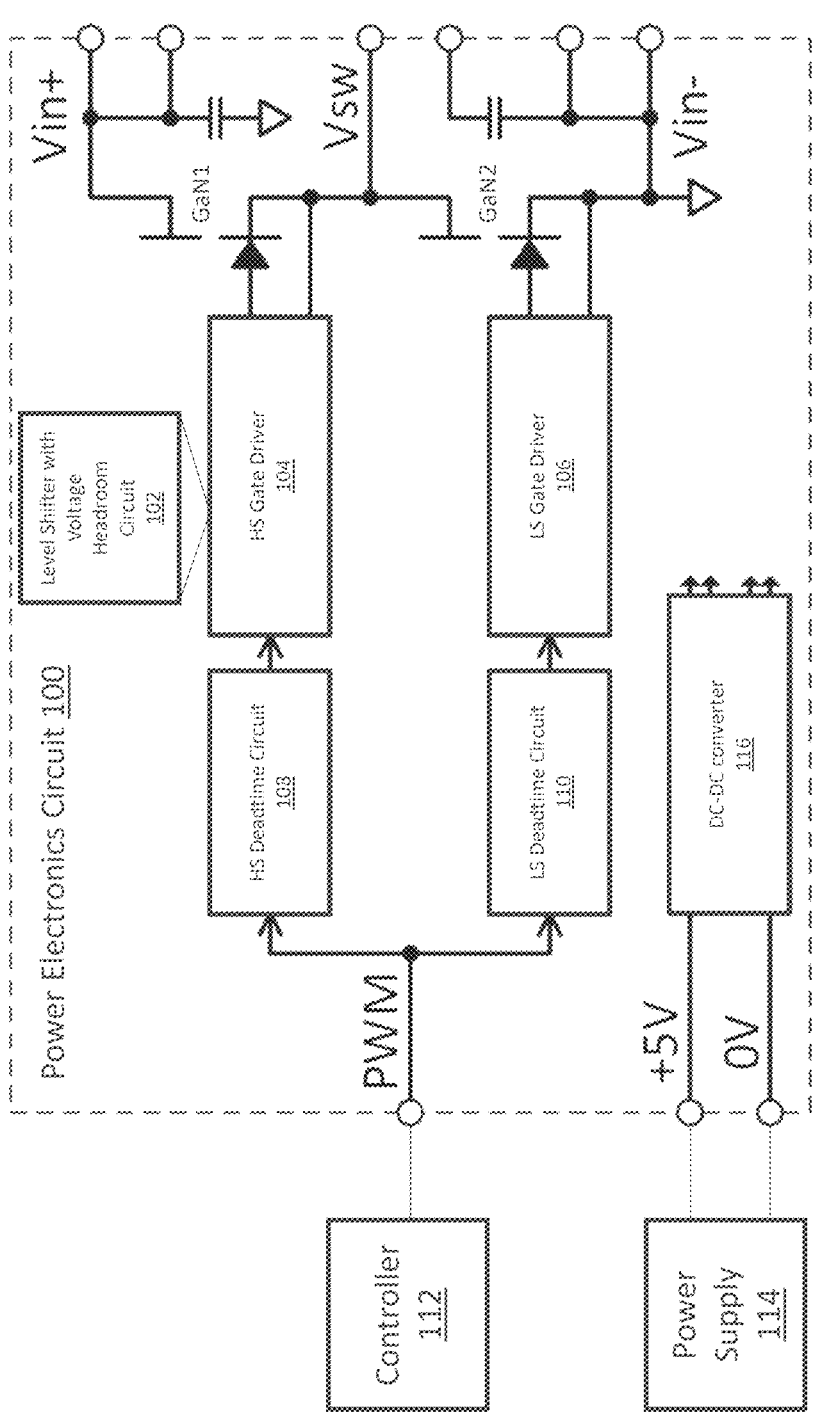
FIG. 1 illustrates a schematic diagram of an embodiment of a power electronics circuit that includes a level shifter having a voltage headroom circuit for mitigating voltage headroom loss.

FIG. 1 illustrates a schematic diagram of an embodiment of a power electronics circuit 100 that includes a level shifter 102. The power electronics circuit 100 may be part of a power electronics assembly for use in various power applications such as in a DC/AC inverter, a DC/DC converter, an AC/DC converter, a DC/AC converter, an AC/AC converter, a multi-phase inverter, an H-bridge, etc. For example, the power electronics circuit 100 may be configured as a buck, boost, or buck-boost converter by coupling an output inductor (not shown) to a switch node Vsw of the power electronics circuit 100.

The switch node Vsw of the power electronics circuit 100 is formed by coupling a high-side GaN switch device GaN1 in series with a low-side GaN switch device GaN2, and has a variable electric potential difference when the power electronics circuit 100 is in use. Depending on the DC bus voltage Vin+, Vin– applied across the series-connected GaN switch devices GaN1, GaN2, the voltage at the switch node Vsw can range from 400V, e.g., 100V, down to 0V, –2V, –5V or even –8V. The high-side GaN switch device GaN1 and the low-side GaN switch device GaN2 may each be implemented by a single GaN power transistor or by two or more GaN power transistors coupled in parallel, e.g., depending on the current requirements of the load (not shown).

The power electronics circuit 100 also includes a high-side (HS) gate driver 104 for driving the gate of the high-side GaN switch device GaN1 and a low-side (LS) gate driver 106 for driving the gate of the low-side GaN switch device GaN2. The gate drive signals may be current signals, for example. A high-side deadtime circuit 108 and a low-side deadtime circuit 110 ensure that the high-side and low-side GaN switch devices GaN1, GaN2 are not on at the same time. The on/off control of the high-side GaN switch device GaN1 and the low-side GaN switch device GaN2 is indicated by a logic input signal such as a PWM (pulse width modulation) signal generated by a controller 112. A power supply 114 provides power to the power electronics circuit 100, e.g., at 5V. An isolated DC-DC converter 116 takes the power supply input (e.g., +5V or other level) and provides two isolated (e.g., 8V or other level) outputs to the gate drivers 104, 106.

In a typical application of a DC-DC buck converter, in the time interval between when the high-side GaN switch device GaN1 is active and the low-side GaN switch device GaN2 is active, the deadtime circuits 108, 110 impose a dead time during which both of the GaN switch devices GaN1, GaN2 are off. During the dead time, the output inductor (not shown) forces a current to flow, and as a consequence, the switching node Vsw of the power electronics circuit 100 is forced to a negative value. Since GaN transistors are used to implement the power switch devices GaN1, GaN2, the low-side GaN switch device GaN2 does not have a body diode but can conduct current if the voltage between the drain and gate creates a channel. Consequently, the switch node Vsw of the power electronics circuit 100 may be forced to a more negative voltage such as in a range of –2V to –5V or even more negative (e.g., –8V).

If left unmitigated, the voltage headroom loss that results from such negative voltages at the switch node Vsw of the power electronics circuit 100 would typically mean that the high-side GaN switch device GaN1 could not be properly driven. At a switch node voltage of –2V or more negative, little to no voltage headroom exists and the gate drive current signal cannot be reliably propagated from the high-side gate driver 104 to the high-side GaN switch device GaN1, where the voltage headroom is the minimum voltage needed by the level shifter 102 to ensure propagation of the gate drive current signal. Absent sufficient voltage headroom, the gate drive current signal does not reliably propagate to the driver 104 for the high-side GaN switch device GaN1.

However, the level shifter 102 described herein has a voltage headroom circuit that mitigates voltage headroom loss, independent of the electric potential difference of the switch node Vsw. Accordingly, the high-side gate driver 104 is still able to robustly drive the gate of the high-side GaN switch device GaN1 even when the switch node Vsw of the power electronics circuit 100 is at a negative voltage. In one embodiment, the electric potential difference of the switch node Vsw can drop to a voltage in a range of 0V to –8V (e.g., –2V to –5V) and the level shifter 102 still ensures the high-side gate driver 104 properly drives the gate of the high-side GaN switch device GaN1.

Figure 2:
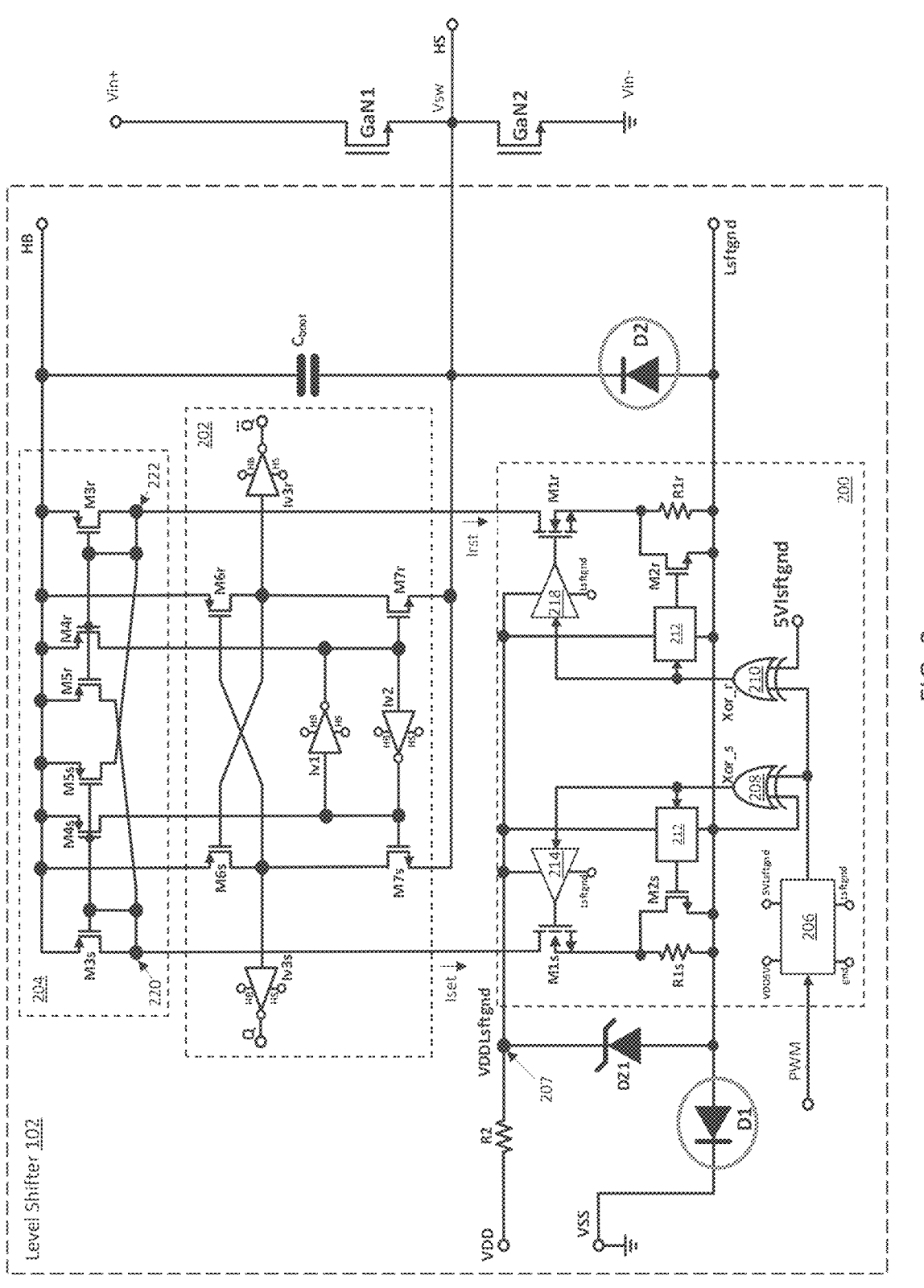
FIG. 2 illustrates a circuit schematic of the level shifter, according to an embodiment.

FIG. 2 illustrates a circuit schematic of the level shifter 102, according to an embodiment. The level shifter 102 includes a current pulse generation circuit 200, a latch 202, and a current mirror circuit 204. The current pulse generation circuit 200 is coupled to a first supply rail VDD and a first reference rail Vss, the first reference rail being at ground (gnd). The current pulse generation circuit 200 has two current injection paths that output non-overlapping first (set) and second (reset) current pulses Iset, Irst based on opposite edges of the logic input signal PWM and used to set or reset the latch 202.

The latch 202 and the current mirror circuit 204 are coupled to a second supply rail HB and a second reference rail HS, where the voltage of the second supply rail HB may correspond to a voltage of a bootstrap capacitor Cboot. The current mirror circuit 204 mirrors the non-overlapping first and second current pulses Iset, Irst output by the current pulse generation circuit 200, such that the latch 202 is set when the first current pulse Iset is active and reset when the second current pulse Irst is active. The second reference rail HS corresponds to the switch node Vsw of the power electronics circuit 100 shown in FIG. 1, and has a variable electric potential difference when the power electronics circuit 100 is use. The level shifter 102 includes a voltage headroom circuit that mitigates voltage headroom loss between the second supply rail HB and the first reference rail VSS, independent of the electric potential difference of the second reference rail HS.

If the voltage headroom circuit were omitted, voltage headroom loss between the second supply rail HB and the first reference rail VSS may prevent the current pulse generation circuit 200 from generating adequate set and reset pulse currents Iset, Irst for shifting between the VDD and HB voltage domains. For example, an electric potential difference of 5V may be present between the second supply rail HB and the first reference rail VSS when the second reference rail HS is at 0V. In this example, the 5V headroom is adequate for the current pulse generation circuit 200 to generate robust set and reset pulse currents Iset, Irst and therefore shift between the VDD and HB voltage domains. However, if the second reference rail HS is at –2V, only 3V of headroom is available between the second supply rail HB and the first reference rail VSS. At a 3V headroom, the set and reset pulse currents Iset, Irst generated by the current pulse generation circuit 200 may not be strong enough to adequately shift between the VDD and HB voltage domains. The voltage headroom loss becomes even greater when the second reference rail HS is at –5V or even –8V. Under these conditions, there is no voltage headroom for the level shifter 102 to function properly. The voltage headroom circuit advantageously mitigates voltage headroom loss between the second supply rail HB and the first reference rail VSS, independent of the electric potential difference of the second reference rail HS.

In FIG. 2, the voltage headroom circuit includes a first diode D1 and a second diode D2. The cathode of the first diode D1 is coupled to the first reference rail VSS and the anode of the first diode D1 is coupled to a reference node Lsftgnd of the current pulse generation circuit 200. The cathode of the second diode D1 is coupled to the second reference rail HS and the anode of the second diode D2 is coupled to the reference node Lsftgnd of the current pulse generation circuit 200.

According to this embodiment, the first diode D1 of the voltage headroom circuit couples the reference node Lsftgnd of the current pulse generation circuit 200 to the first reference rail VSS when the second reference rail HS is more positive than the first reference rail VSS. Likewise, the second diode D2 of the voltage headroom circuit couples the reference node Lsftgnd of the current pulse generation circuit 200 to the second reference rail HS when the second reference rail HS is more negative than the first reference rail VSS by at least one diode voltage drop. In other words, the first and second diodes D1, D2 of the voltage headroom circuit form a sort of minimum selector between the two reference nodes VSS, HS, by selecting the lower one of the two reference nodes VSS, HS as the reference node Lsftgnd of the current pulse generation circuit 200. This way, the reference node Lsftgnd of the current pulse generation circuit 200 is pulled below ground when the second reference rail HS becomes negative, ensuring sufficient voltage headroom is maintained for the current pulse generation circuit 200 to generate robust set and reset pulse currents Iset, Irst and therefore shift between the VDD and HB voltage domains.

In FIG. 2, the voltage headroom circuit of the level shifter 102 may also include a local voltage supply VDDLsftgnd generated from the first supply rail VDD and a signal level shifter 206 that transforms the logic input signal PWM from a first domain defined by the first supply rail VDD (e.g., 5V or another level) and ground (gnd) to a second domain defined by the local voltage supply VDDLsftgnd (e.g., 5V or another level) and the electric potential at the reference node Lsftgnd of the current pulse generation circuit 200. As explained above, the electric potential at the reference node Lsftgnd of the current pulse generation circuit 200 is at the lower of VSS or HS. Corresponding exclusive or (XOR) logic gates 208, 210 for the set and reset branches of the current pulse generation circuit 200 output a logic set signal Xor_s or reset signal Xor_r, based on the output of the signal level shifter 206.

The set branch of the current pulse generation circuit 200 includes a pulse generator 212 such as a positive edge pulse generator that generates a pulse based on the output of the set XOR logic gate 208 and a driver 214 also controlled by the output of the set XOR logic gate 208. When the output of the set XOR logic gate 208 goes high (e.g., logic 1 level), NMOS transistor M1*s* in conjunction with NMOS boost transistor M2*s* pulls current through resistor R1*s*. The current path that includes NMOS transistor M1*s*, NMOS boost transistor M2*s*, and resistor R1*s* outputs the set current Iset for the set branch of the current mirror circuit 204.

The reset branch of the current pulse generation circuit 200 may be symmetric, with a pulse generator 216 such as a positive edge pulse generator for generating a pulse based on the output of the reset XOR logic gate 210 and a driver 218 also controlled by the output of the reset XOR logic gate 210. When the output of the reset XOR logic gate 210 goes high (e.g., logic 1 level), NMOS transistor M1*r* in conjunction with NMOS boost transistor M2*r* pulls current through resistor R1*r*. The current path that includes NMOS transistor M1*r*, NMOS boost transistor M2*r* and resistor R1*r* outputs the reset current Irst for the reset branch of the current mirror circuit 204.

In one embodiment, the local voltage supply VDDLsftgnd of the voltage headroom circuit includes a resistor R2 and a Zener diode DZ1. The resistor R2 is coupled between the first supply rail VDD and a voltage node 207 of the current pulse generation circuit 200 that is at VDD above Isftgnd. The anode of the Zener diode DZ1 is coupled to the reference node Lsftgnd of the current pulse generation circuit 200. The cathode of the Zener diode DZ1 is coupled to the voltage node 207 of the current pulse generation circuit 200 that is at VDD above Isftgnd. The Zener diode DZ1 generates the local voltage supply VDDLsftgnd in this embodiment, by acting as a local regulator. Diode DZ1 of the current pulse generation circuit 200 may be an actual Zener diode or a diode device having Zener-like clamping functionality.

The current mirror circuit 204 has mirroring paths for mirroring the first and second current pulses Iset, Irst generated by the current pulse generation circuit 200. In one embodiment, the mirroring paths of the current mirror circuit 204 are symmetric. For example, both current mirroring paths of the current mirror circuit 204 may include PMOS transistors 'M3*s*-M5*s*' and 'M3*r*-M5*r*', where the PMOS transistors M3*s*-M5*s* of the first (set) current mirroring path and the PMOS transistors M3*r*-M5*r* of the second (reset) current mirroring path have matching transconductance.

The source of each PMOS transistor M3*s*-M5*s* of the first current mirroring path is coupled to the second supply rail HB. The gate of each PMOS transistor M3*s*-M5 of the first current mirroring path is driven by the first current pulse Iset generated by the current pulse generation circuit 200. Likewise, the source of each PMOS transistor M3*r*-M5*r* of the second current mirroring path is coupled to the second supply rail HB. The gate of each PMOS transistor M3*r*-M5*r* of the second current mirroring path is driven by the second current pulse Irst generated by the current pulse generation circuit 200.

The drain of a first PMOS transistor M3*s* of the first current mirroring path may be coupled to a node 220 of the first current mirroring path into which the first current pulse Iset flows. Likewise, the drain of a first PMOS transistor M3*r* of the second current mirroring path may be coupled to a node 222 of the second current mirroring path into which the second current pulse Irst flows. The first PMOS transistor M3*s*, M3*r* of both current mirroring paths are the main devices of the respective mirroring paths, where the current of each first PMOS transistor M3*s*, M3*r* is set by the corresponding current pulse Iset, Irst generated by the current pulse generation circuit 200 in the low voltage (VDD) domain.

The drain of a third PMOS transistor M5*s* of the first current mirroring path may be cross-coupled to the node 222 of the second current mirroring path into which the second current pulse Irst flows. The drain of a third PMOS transistor M5*r* of the second current mirroring path may be cross-coupled to the node 220 of the first current mirroring path into which the first current pulse Iset flows.

The drain of a second PMOS transistor M3s of the first current mirroring path may drive a gate of an NMOS transistor M7s of the latch 202. Likewise, the drain of a second PMOS transistor M3r of the second current mirroring path may drive a gate of an NMOS transistor M7r of the latch 202. NMOS transistor M7s and NMOS transistor M7r may have a source coupled to the second reference rail HS. PMOS transistor M6s of the latch 202 may have a drain coupled to the drain of NMOS transistor M7s and a source coupled to the second supply rail HB. Likewise, PMOS transistor M6r of the latch 202 may have a drain coupled to the drain of NMOS transistor M7r and a source coupled to the second supply rail HB. The latch 202 may have a symmetric arrangement of buffers Iv1, Iv2, Iv3s, Iv3r that are cross-coupled via NMOS transistors M7s and M7r and PMOS transistors M6s and M6r to form a latch circuit with a stored bit Q and its complement Q̄. The latched output Q/Q̄ is provided to the high-side gate driver 104 for driving the gate of the high-side GaN switch device GaN1 shown n FIG. 1. Other latch and current mirror circuits may be used.

Figure 3:
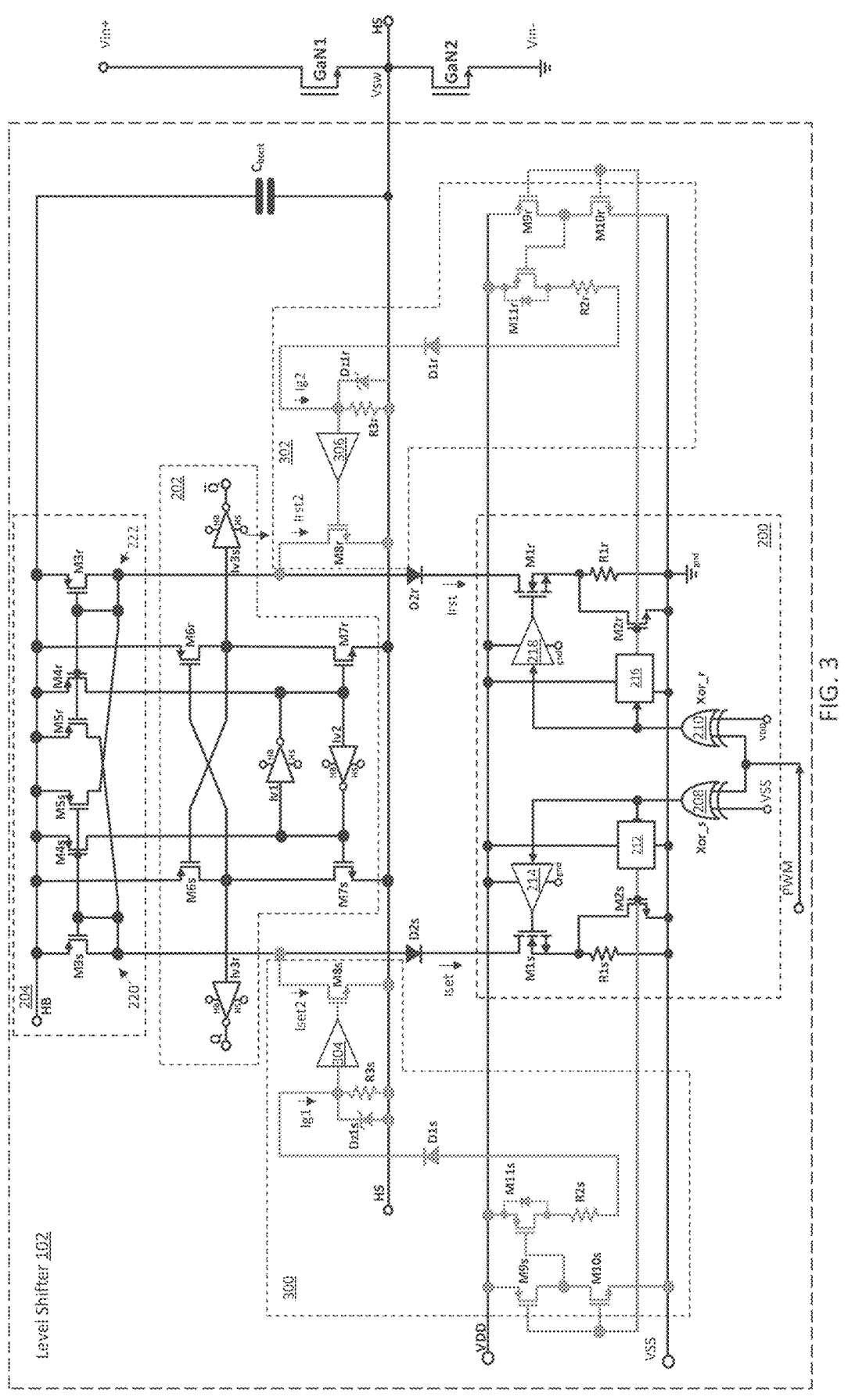
FIG. 3 illustrates a circuit schematic of the level shifter, according to another embodiment.

FIG. 3 illustrates a circuit schematic of the level shifter 102, according to another embodiment. According to this embodiment, the voltage headroom circuit of the level shifter 102 activates an additional current injection path for setting or resetting the latch 202 when the second reference rail HS is more negative than the first reference rail VSS by at least one diode voltage drop.

In FIG. 3, the voltage headroom circuit of the level shifter 102 includes a first additional current injection path 300 and a second additional current injection path 302. The first additional current injection path 300 of the voltage headroom circuit injects an additional current pulse Iset2 into the first (set) branch of the current mirror circuit 204 that mirrors the first (set) current pulse Iset, when the second reference rail HS is more negative than the first reference rail VSS by at least one diode voltage drop and a first (rising or falling) edge of the logic input signal PWM is detected, e.g., by the set XOR logic gate 208 of the current pulse generation circuit 200. The second additional current injection path 302 of the voltage headroom circuit injects an additional current pulse Irst2 into the second (reset) branch of the current mirror circuit 204 that mirrors the second current pulse Irst, when the second reference rail HS is more negative than the first reference rail VSS by at least one diode voltage drop and a second (falling or rising) edge of the logic input signal PWM is detected, e.g., by the reset XOR logic gate 210 of the current pulse generation circuit 200.

When the variable electric potential difference of the second reference rail Hs is in a range of 0V to −8V, e.g., in a range of −2V to −5V, the amplitude of the first and second current pulses Iset, Irst generated by the current pulse generation circuit 200 in FIG. 3 decreases proportionally as a function of the electric potential difference of the second reference rail HS. The first additional current injection path 300 of the voltage headroom circuit injects the additional set current pulse Iset2 into the first (set) branch of the current mirror circuit 204 when the first (rising or falling) edge of the logic input signal PWM is detected by the current pulse generation circuit 200. The second additional current injection path 302 of the voltage headroom circuit injects the additional reset current pulse Irst2 into the second (reset) branch of the current mirror circuit 204 when the second (falling or rising) edge of the logic input signal PWM is detected by the current pulse generation circuit 200.

In FIG. 3, the first additional current injection path 300 of the voltage headroom circuit includes an NMOS transistor M8s having a drain coupled to the first (set) branch of the current mirror circuit 204 and a source coupled to the second reference rail HS. A first gate driver 304 is coupled to the gate of the NMOS transistor M8s. A first resistor R3s is coupled between an input of the first gate driver 304 and the second reference rail HS. The cathode of a diode D1s is coupled to the input of the first gate driver 304. A second gate driver formed by PMOS transistor M9s and NMOS transistor M10s is coupled between the first supply rail VDD and the first reference rail VSS and has an input controlled based on a first (rising or falling) edge of the logic input signal PWM, e.g., as indicated by the first pulse generator 212 of the current pulse generation circuit 200. A PMOS transistor M11s has a source coupled to the first supply rail VDD and a gate coupled to an output of the second gate driver formed by PMOS transistor M9s and NMOS transistor M10s. A second resistor R2s is coupled between a drain of PMOS transistor M11s and the anode of the diode D1s. The first additional current injection path 300 of the voltage headroom circuit may also include a Zener protection diode Dz1s having a cathode coupled to the input of the first gate driver 304 and an anode coupled to the second reference rail HS.

The PMOS transistor M11s, the second resistor R2s and the diode D1s of the first additional current injection path 300 inject current Ig1 into the first resistor R3s when the gate of the PMOS transistor M11s is activated by the second gate driver (M9s and M10s) and the second reference rail HS is more negative than the first reference rail VSS by at least one voltage drop of the diode D1s. The first additional current injection path 300 of the voltage headroom circuit activates the additional current pulse Iset2 only if the potential of the second reference rail HS drops below the value necessary to generate a voltage across the first resistor R3s that is higher than the threshold of the first gate driver 304. Activation of the first (set) additional current pulse Iset2 is done by the diode D1s of the first additional current injection path 300, which behaves like a switch that allows the first (set) additional current pulse Iset2 only when the second reference rail HS drops at least one forward diode drop below the first supply rail VDD. When this happens, the branch of the first additional current injection path 300 that includes NMOS transistor M8s, the second resistor R2s, and the diode D1s delivers a voltage across the first resistor R3s. When the voltage of the second reference rail HS drops below the first supply rail VDD by enough to cross the threshold of the first gate driver 304, the NMOS transistor M8s injects current Iset2 into the current mirror formed by PMOS transistors M3s and M4s. These currents Iset, Iset2 then set the latch 202.

Likewise, the second additional current injection path 302 of the voltage headroom circuit includes an NMOS transistor M8r having a drain coupled to the second (reset) branch of the current mirror circuit 204 and a source coupled to the second reference rail HS. A first gate driver 306 is coupled to the gate of the NMOS transistor M8r. A first resistor R3r is coupled between an input of the first gate driver 306 and the second reference rail HS. The cathode of a diode D1r is coupled to the input of the first gate driver 306. A second gate driver formed by PMOS transistor M9r and NMOS transistor M10r is coupled between the first supply rail VDD and the first reference rail VSS and has an input controlled based on a second (falling or rising) edge of the logic input signal PWM, e.g., as indicated by the second pulse generator 216 of the current pulse generation circuit 200. A PMOS transistor M11r has a source coupled to the first supply rail VDD and a gate coupled to an output of the second gate driver formed by PMOS transistor M9r and NMOS transistor M10$r$. A second resistor R2$r$ is coupled between a drain of PMOS transistor M11$r$ and the anode of the diode D1$r$. The second additional current injection path 302 of the voltage headroom circuit may also include a Zener protection diode Dz1$r$ having a cathode coupled to the input of the first gate driver 306 and an anode coupled to the second reference rail HS.

The PMOS transistor M11$r$, the second resistor R2$r$ and the diode D1$r$ of the second additional current injection path 302 inject current Ig2 into the first resistor R3$r$ when the gate of the PMOS transistor M11$r$ is activated by the second gate driver (M9$r$ and M10$r$) and the second reference rail HS is more negative than the first reference rail VSS by at least one voltage drop of the diode D1$r$. The second additional current injection path 302 of the voltage headroom circuit activates the additional current pulse Irst2 only if the potential of the second reference rail HS drops below the value necessary to generate a voltage across the first resistor R3$r$ that is higher than the threshold of the first gate driver 306. Activation of the second (reset) additional current pulse Irst2 is done by the diode D1$r$ of the second additional current injection path 302, which behaves like a switch that allows the second (reset) additional current pulse Irst2 only when the second reference rail HS drops at least one forward diode drop below the first supply rail VDD. When this happens, the branch of the second additional current injection path 302 that includes NMOS transistor M8$r$, the second resistor R2$r$, and the diode D1$r$ delivers a voltage across the first resistor R3$r$. When the voltage of the second reference rail HS drops below the first supply rail VDD by enough to cross the threshold of the first gate driver 306, the NMOS transistor M8$r$ injects current Irst2 into the current mirror formed by PMOS transistors M3$r$ and M4$r$. These currents Irst, Irst2 then reset the latch 202.

In the following example, the first (set) branch of the current pulse generation circuit 200 is activated by a positive (rising) edge of the logic input signal PWM and the second (reset) branch of the current pulse generation circuit 200 is activated by a negative (falling) edge of the logic input signal PWM. At a positive PWM edge, a current pulse Iset is injected into the current mirror formed by PMOS transistors M3$s$ and M4$s$. The mirror output pulse sets the latch 202. At a negative PWM edge, a current pulse Irst is injected into the current mirror formed by PMOS transistors M3$r$ and M4$r$. The mirror output pulse resets the latch 202. When the second reference rail HS is at a positive electric potential, the additional current injection paths 300, 302 of the voltage headroom circuit are inactive and the set and reset current pulses Iset, Irst for setting and resetting the latch 202 are generated exclusively by the current pulse generation circuit 200. More particularly, NMOS transistor M1$s$, NMOS boost transistor M2$s$, resistor R1$s$, pulse generator 212, and driver 214 exclusively generate the set current pulse Iset and NMOS transistor M1$r$, NMOS boost transistor M2$r$, resistor R1$r$, pulse generator 216, and driver 218 exclusively generate the reset current pulse Irst when the second reference rail HS is above ground.

When the second reference rail HS is more negative than at least one forward diode drop, at least part of the set and reset current pulses Iset, Irst for setting and resetting the latch 202 are generated by the additional current injection paths 300, 302 of the voltage headroom circuit. More particularly, NMOS transistor M8$s$, gate driver 304, resistor R3$s$, diode D1$s$, resistor R2$s$, and PMOS transistor M11$s$ of the first additional current injection path 300 generate an additional current Iset2 for helping to set the latch 202 and NMOS transistor M8$r$, gate driver 306, resistor R3$r$, diode D1$r$, resistor R2$r$, and PMOS transistor M11$r$ of the second additional current injection path 302 generate an additional current Irst2 for helping to reset the latch 202. If the second reference rail HS becomes negative enough, e.g., more negative than −3V, the voltage headroom loss is so large that the current pulse generation circuit 200 no longer contributes to the set and reset currents Iset, Irst. Under these conditions, the additional current injection paths 300, 302 of the voltage headroom circuit generate the full magnitude of the set and reset current pulses Iset, Irst for setting and resetting the latch 202.

Although the present disclosure is not so limited, the following numbered examples demonstrate one or more aspects of the disclosure.

Example 1. A level shifter, comprising: a current pulse generation circuit coupled to a first supply rail and a first reference rail and configured to output non-overlapping first and second current pulses based on opposite edges of a logic input signal, the first reference rail being at ground; a latch and a current mirror circuit coupled to a second supply rail and a second reference rail, the current mirror circuit configured to mirror the non-overlapping first and second current pulses such that the latch is set when the first current pulse is active and reset when the second current pulse is active; and a voltage headroom circuit configured to mitigate voltage headroom loss between the second supply rail and the first reference rail, independent of an electric potential difference of the second reference rail.

Example 2. The level shifter of example 1, wherein the electric potential difference of the second reference rail is configured to drop to a negative voltage in a range of 0V to −8V.

Example 3. The level shifter of example 1 or 2, wherein the voltage headroom circuit is configured to couple a reference node of the current pulse generation circuit to the first reference rail when the second reference rail is more positive than the first reference rail, and wherein the voltage headroom circuit is configured to couple the reference node of the current pulse generation circuit to the second reference rail when the second reference rail is more negative than the first reference rail by at least one diode voltage drop.

Example 4. The level shifter of any of examples 1 through 3, wherein the voltage headroom circuit comprises: a first diode having a cathode coupled to the first reference rail and an anode coupled to a reference node of the current pulse generation circuit; and a second diode having a cathode coupled to the second reference rail and an anode coupled to the reference node of the current pulse generation circuit.

Example 5. The level shifter of example 4, wherein the voltage headroom circuit further comprises: a local voltage supply generated from the first supply rail; and a signal level shifter that transforms the logic input signal from a first domain defined by the first supply rail and ground to a second domain defined by the local voltage supply and the electric potential at the reference node of the current pulse generation circuit.

Example 6. The level shifter of example 5, wherein the local voltage supply comprises: a resistor coupled between the first supply rail a high voltage node of the current pulse generation circuit; and a Zener diode having an anode coupled to the reference node of the current pulse generation circuit and a cathode coupled to high voltage node of the current pulse generation circuit.

Example 7. The level shifter of any of examples 1 through 6, wherein the voltage headroom circuit is configured to activate an additional current injection path for setting or resetting the latch when the second reference rail is more negative than the first reference rail by at least one diode voltage drop.

Example 8. The level shifter of any of examples 1 through 7, wherein the voltage headroom circuit comprises: a first additional current injection path configured to inject an additional current pulse into a first branch of the current mirror circuit that mirrors the first current pulse, when the second reference rail is more negative than the first reference rail by at least one diode voltage drop and a first edge of the logic input signal is detected; and a second additional current injection path configured to inject an additional current pulse into a second branch of the current mirror circuit that mirrors the second current pulse, when the second reference rail is more negative than the first reference rail by at least one diode voltage drop and a second edge of the logic input signal is detected.

Example 9. The level shifter of example 8, wherein for the electric potential difference of the second reference rail being in a range of 0V to −8V: an amplitude of the first and second current pulses decreases proportionally as a function of the electric potential difference of the second reference rail; the first additional current injection path is configured to inject the additional current pulse into the first branch of the current mirror circuit when the first edge of the logic input signal is detected; and the second additional current injection path is configured to inject the additional current pulse into the second branch of the current mirror circuit when the second edge of the logic input signal is detected.

Example 10. The level shifter of example 8 or 9, wherein the first additional current injection path comprises: an NMOS transistor having a drain coupled to the first branch of the current mirror circuit and a source coupled to the second reference rail; a first gate driver coupled to a gate of the NMOS transistor; a first resistor coupled between an input of the first gate driver and the second reference rail; a diode having a cathode coupled to the input of the first gate driver; a second gate driver coupled between the first supply rail and the first reference rail and having an input controlled based on a first edge of the logic input signal; a PMOS transistor having a source coupled to the first supply rail and a gate coupled to an output of the second gate driver; and a second resistor coupled between a drain of the PMOS transistor and an anode of the diode.

Example 11. The level shifter of example 10, wherein the PMOS transistor, the second resistor and the diode inject current into the first resistor when the gate of the PMOS transistor is activated by the second gate driver and the second reference rail is more negative than the first reference rail by at least one voltage drop of the diode.

Example 12. The level shifter of example 10 or 11, wherein the first additional current injection path further comprises: a Zener diode having a cathode coupled to the input of the first gate driver and an anode coupled to the second reference rail.

Example 13. The level shifter of any of examples 8 through 12, wherein the second additional current injection path comprises: an NMOS transistor having a drain coupled to the second branch of the current mirror circuit and a source coupled to the second reference rail; a first gate driver coupled to a gate of the NMOS transistor; a first resistor coupled between an input of the first gate driver and the second reference rail; a diode having a cathode coupled to the input of the first gate driver; a second gate driver coupled between the first supply rail and the first reference rail and having an input controlled based on a second edge of the logic input signal; a PMOS transistor having a source coupled to the first supply rail and a gate coupled to an output of the second gate driver; and a second resistor coupled between a drain of the PMOS transistor and an anode of the diode.

Example 14. The level shifter of example 13, wherein the PMOS transistor, the second resistor and the diode inject current into the first resistor when the gate of the PMOS transistor is activated by the second gate driver and the second reference rail is more negative than the first reference rail by at least one voltage drop of the diode.

Example 15. The level shifter of example 13 or 14, wherein the second additional current injection path further comprises: a Zener diode having a cathode coupled to the input of the first gate driver and an anode coupled to the second reference rail.

Example 16. A power electronics circuit, comprising: a power converter circuit comprising a high-side GaN switch device coupled in series with a low-side GaN switch device at a switch node; a first gate driver configured to drive a gate of the low-side GaN switch device; and a second gate driver configured to drive a gate of the high-side GaN switch device, wherein the second gate driver comprises: a current pulse generation circuit coupled to a first supply rail and a first reference rail and configured to output non-overlapping first and second current pulses based on opposite edges of a logic input signal, the first reference rail being at ground; a latch and a current mirror circuit coupled to a second supply rail and a second reference rail, the current mirror circuit configured to mirror the non-overlapping first and second current pulses such that the latch is set when the first current pulse is active and reset when the second current pulse is active, the second reference rail corresponding to the switch node of the power converter circuit; and a voltage headroom circuit configured to mitigate voltage headroom loss between the second supply rail and the first reference rail, independent of an electric potential difference of the second reference rail.

Example 17. The power electronics circuit of example 16, wherein the voltage headroom circuit comprises: a first diode having a cathode coupled to the first reference rail and an anode coupled to a reference node of the current pulse generation circuit; and a second diode having a cathode coupled to the second reference rail and an anode coupled to the reference node of the current pulse generation circuit.

Example 18. The power electronics circuit of example 16 or 17, wherein the voltage headroom circuit comprises: a first additional current injection path configured to inject an additional current pulse into a first branch of the current mirror circuit that mirrors the first current pulse, when the second reference rail is more negative than the first reference rail by at least one diode voltage drop and a first edge of the logic input signal is detected; and a second additional current injection path configured to inject an additional current pulse into a second branch of the current mirror circuit that mirrors the second current pulse, when the second reference rail is more negative than the first reference rail by at least one diode voltage drop and a second edge of the logic input signal is detected.

Example 19. The power electronics circuit of example 18, wherein the first additional current injection path comprises: an NMOS transistor having a drain coupled to the first branch of the current mirror circuit and a source coupled to the second reference rail; a first gate driver coupled to a gate of the NMOS transistor; a first resistor coupled between an input of the first gate driver and the second reference rail; a diode having a cathode coupled to the input of the first gate driver; a second gate driver coupled between the first supply rail and the first reference rail and having an input controlled based on a first edge of the logic input signal; a PMOS transistor having a source coupled to the first supply rail and a gate coupled to an output of the second gate driver; and a second resistor coupled between a drain of the PMOS transistor and an anode of the diode.

Example 20. The power electronics circuit of example 18 or 19, wherein the second additional current injection path comprises: an NMOS transistor having a drain coupled to the second branch of the current mirror circuit and a source coupled to the second reference rail; a first gate driver coupled to a gate of the NMOS transistor; a first resistor coupled between an input of the first gate driver and the second reference rail; a diode having a cathode coupled to the input of the first gate driver; a second gate driver coupled between the first supply rail and the first reference rail and having an input controlled based on a second edge of the logic input signal; a PMOS transistor having a source coupled to the first supply rail and a gate coupled to an output of the second gate driver; and a second resistor coupled between a drain of the PMOS transistor and an anode of the diode.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A level shifter, comprising:
a current pulse generation circuit coupled to a first supply rail and a first reference rail and configured to output non-overlapping first and second current pulses based on opposite edges of a logic input signal, the first reference rail being at ground;
a latch and a current mirror circuit coupled to a second supply rail and a second reference rail, the current mirror circuit configured to mirror the non-overlapping first and second current pulses such that the latch is set when the first current pulse is active and reset when the second current pulse is active; and
a voltage headroom circuit configured to mitigate voltage headroom loss between the second supply rail and the first reference rail, independent of an electric potential difference of the second reference rail.

2. The level shifter of claim 1, wherein the electric potential difference of the second reference rail is configured to drop to a negative voltage in a range of 0V to −8V.

3. The level shifter of claim 1, wherein the voltage headroom circuit is configured to couple a reference node of the current pulse generation circuit to the first reference rail when the second reference rail is more positive than the first reference rail, and wherein the voltage headroom circuit is configured to couple the reference node of the current pulse generation circuit to the second reference rail when the second reference rail is more negative than the first reference rail by at least one diode voltage drop.

4. The level shifter of claim 1, wherein the voltage headroom circuit comprises:
a first diode having a cathode coupled to the first reference rail and an anode coupled to a reference node of the current pulse generation circuit; and
a second diode having a cathode coupled to the second reference rail and an anode coupled to the reference node of the current pulse generation circuit.

5. The level shifter of claim 4, wherein the voltage headroom circuit further comprises:
a local voltage supply generated from the first supply rail; and
a signal level shifter that transforms the logic input signal from a first domain defined by the first supply rail and ground to a second domain defined by the local voltage supply and the electric potential at the reference node of the current pulse generation circuit.

6. The level shifter of claim 5, wherein the local voltage supply comprises:
a resistor coupled between the first supply rail and a high voltage node of the current pulse generation circuit; and
a Zener diode having an anode coupled to the reference node of the current pulse generation circuit and a cathode coupled to the high voltage node of the current pulse generation circuit.

7. The level shifter of claim 1, wherein the voltage headroom circuit is configured to activate an additional current injection path for setting or resetting the latch when the second reference rail is more negative than the first reference rail by at least one diode voltage drop.

8. The level shifter of claim 1, wherein the voltage headroom circuit comprises:
a first additional current injection path configured to inject an additional current pulse into a first branch of the current mirror circuit that mirrors the first current pulse, when the second reference rail is more negative than the first reference rail by at least one diode voltage drop and a first edge of the logic input signal is detected; and
a second additional current injection path configured to inject an additional current pulse into a second branch of the current mirror circuit that mirrors the second current pulse, when the second reference rail is more negative than the first reference rail by at least one diode voltage drop and a second edge of the logic input signal is detected.

9. The level shifter of claim 8, wherein for the electric potential difference of the second reference rail being in a range of 0V to −8V:

an amplitude of the first and second current pulses decreases proportionally as a function of the electric potential difference of the second reference rail;

the first additional current injection path is configured to inject the additional current pulse into the first branch of the current mirror circuit when the first edge of the logic input signal is detected; and the second additional current injection path is configured to inject the additional current pulse into the second branch of the current mirror circuit when the second edge of the logic input signal is detected.

10. The level shifter of claim 8, wherein the first additional current injection path comprises:

an NMOS transistor having a drain coupled to the first branch of the current mirror circuit and a source coupled to the second reference rail;

a first gate driver coupled to a gate of the NMOS transistor;

a first resistor coupled between an input of the first gate driver and the second reference rail;

a diode having a cathode coupled to the input of the first gate driver;

a second gate driver coupled between the first supply rail and the first reference rail and having an input controlled based on the first edge of the logic input signal;

a PMOS transistor having a source coupled to the first supply rail and a gate coupled to an output of the second gate driver; and a second resistor coupled between a drain of the PMOS transistor and an anode of the diode.

11. The level shifter of claim 10, wherein the PMOS transistor, the second resistor and the diode inject current into the first resistor when the gate of the PMOS transistor is activated by the second gate driver and the second reference rail is more negative than the first reference rail by at least one voltage drop of the diode.

12. The level shifter of claim 10, wherein the first additional current injection path further comprises:

a Zener diode having a cathode coupled to the input of the first gate driver and an anode coupled to the second reference rail.

13. The level shifter of claim 8, wherein the second additional current injection path comprises:

an NMOS transistor having a drain coupled to the second branch of the current mirror circuit and a source coupled to the second reference rail;

a first gate driver coupled to a gate of the NMOS transistor;

a first resistor coupled between an input of the first gate driver and the second reference rail;

a diode having a cathode coupled to the input of the first gate driver;

a second gate driver coupled between the first supply rail and the first reference rail and having an input controlled based on the second edge of the logic input signal;

a PMOS transistor having a source coupled to the first supply rail and a gate coupled to an output of the second gate driver; and a second resistor coupled between a drain of the PMOS transistor and an anode of the diode.

14. The level shifter of claim 13, wherein the PMOS transistor, the second resistor and the diode inject current into the first resistor when the gate of the PMOS transistor is activated by the second gate driver and the second reference rail is more negative than the first reference rail by at least one voltage drop of the diode.

15. The level shifter of claim 13, wherein the second additional current injection path further comprises:

a Zener diode having a cathode coupled to the input of the first gate driver and an anode coupled to the second reference rail.

16. A power electronics circuit, comprising:

a power converter circuit comprising a high-side GaN switch device coupled in series with a low-side GaN switch device at a switch node;

a first gate driver configured to drive a gate of the low-side GaN switch device; and a second gate driver configured to drive a gate of the high-side GaN switch device, wherein the second gate driver comprises:

a current pulse generation circuit coupled to a first supply rail and a first reference rail and configured to output non-overlapping first and second current pulses based on opposite edges of a logic input signal, the first reference rail being at ground;

a latch and a current mirror circuit coupled to a second supply rail and a second reference rail, the current mirror circuit configured to mirror the non-overlapping first and second current pulses such that the latch is set when the first current pulse is active and reset when the second current pulse is active, the second reference rail corresponding to the switch node of the power converter circuit; and a voltage headroom circuit configured to mitigate voltage headroom loss between the second supply rail and the first reference rail, independent of an electric potential difference of the second reference rail.

17. The power electronics circuit of claim 16, wherein the voltage headroom circuit comprises:

a first diode having a cathode coupled to the first reference rail and an anode coupled to a reference node of the current pulse generation circuit; and a second diode having a cathode coupled to the second reference rail and an anode coupled to the reference node of the current pulse generation circuit.

18. The power electronics circuit of claim 16, wherein the voltage headroom circuit comprises:

a first additional current injection path configured to inject an additional current pulse into a first branch of the current mirror circuit that mirrors the first current pulse, when the second reference rail is more negative than the first reference rail by at least one diode voltage drop and a first edge of the logic input signal is detected; and a second additional current injection path configured to inject an additional current pulse into a second branch of the current mirror circuit that mirrors the second current pulse, when the second reference rail is more negative than the first reference rail by at least one diode voltage drop and a second edge of the logic input signal is detected.

19. The power electronics circuit of claim 18, wherein the first additional current injection path comprises:

an NMOS transistor having a drain coupled to the first branch of the current mirror circuit and a source coupled to the second reference rail;

a first gate driver coupled to a gate of the NMOS transistor;

a first resistor coupled between an input of the first gate driver and the second reference rail;

a diode having a cathode coupled to the input of the first gate driver;

a second gate driver coupled between the first supply rail and the first reference rail and having an input controlled based on the first edge of the logic input signal;

a PMOS transistor having a source coupled to the first supply rail and a gate coupled to an output of the second gate driver; and a second resistor coupled between a drain of the PMOS transistor and an anode of the diode.

20. The power electronics circuit of claim 18, wherein the second additional current injection path comprises:

an NMOS transistor having a drain coupled to the second branch of the current mirror circuit and a source coupled to the second reference rail;

a first gate driver coupled to a gate of the NMOS transistor;

a first resistor coupled between an input of the first gate driver and the second reference rail;

a diode having a cathode coupled to the input of the first gate driver;

a second gate driver coupled between the first supply rail and the first reference rail and having an input controlled based on the second edge of the logic input signal;

a PMOS transistor having a source coupled to the first supply rail and a gate coupled to an output of the second gate driver; and a second resistor coupled between a drain of the PMOS transistor and an anode of the diode.

\* \* \* \* \*